United States Patent [19]
Gonzalez

[11] Patent Number: 5,896,054
[45] Date of Patent: Apr. 20, 1999

[54] CLOCK DRIVER

[75] Inventor: David M. Gonzalez, Elgin, Ill.

[73] Assignee: Motorola, Inc., Schaumburg, Ill.

[21] Appl. No.: 08/760,766

[22] Filed: Dec. 5, 1996

[51] Int. Cl.⁶ .................................................. H03K 17/30
[52] U.S. Cl. ...................... 327/268; 327/272; 327/283; 327/285
[58] Field of Search .................................. 327/551, 558, 327/263, 264, 268, 272, 278, 283, 285, 336, 344, 91, 94, 356

[56] References Cited

U.S. PATENT DOCUMENTS

| | | | |
|---|---|---|---|
| 4,069,429 | 1/1978 | White et al. | 307/265 |
| 4,749,951 | 6/1988 | Tanaka | 328/167 |
| 4,849,654 | 7/1989 | Okada | 307/296.4 |
| 5,041,741 | 8/1991 | Steele | 307/443 |
| 5,055,706 | 10/1991 | Nakai et al. | 307/265 |
| 5,120,996 | 6/1992 | Mead et al. | 307/353 |
| 5,164,621 | 11/1992 | Miyamoto | 307/591 |
| 5,214,316 | 5/1993 | Nagai | 307/272.3 |
| 5,382,840 | 1/1995 | Massoner | 327/206 |
| 5,532,969 | 7/1996 | Houghton et al. | 365/226 |
| 5,623,218 | 4/1997 | Kim | 327/18 |

Primary Examiner—Timothy P. Callahan
Assistant Examiner—An T. Luu
Attorney, Agent, or Firm—Randall S. Vaas

[57] ABSTRACT

A clock driver circuit (100) comprises an input (102) for a reference clock signal. A filter (106) is connected to the input to receive the reference signal and output a filtered signal. A complementary FET driver circuit (108) having a cross-over threshold is coupled to the filter to receive the filtered signal and output a conditioned clock signal.

20 Claims, 2 Drawing Sheets

CLOCK DRIVER

FIELD OF THE INVENTION

The present invention pertains to clock drivers, and more particularly to an efficient clock signal driver.

BACKGROUND OF THE INVENTION

Power conservation is important in battery powered devices such as pagers, computers, personal digital assistants, radiotelephones, cellular radiotelephones, and the like. These devices typically include a clock driver circuit. Power dissipation is of particular concern for the clock circuit because it is always active, even in standby mode.

It is known to use a standard CMOS output stage as a clock driver because of the favorable current characteristics. The current dissipation due to the load is:

$$Vcc*CL*F=2.75*10 \text{ pF}*13 \text{ MHz}=358 \text{ uA} \qquad \text{(Equation 1)}$$

where Vcc is the supply voltage; CL is the load capacitance; and F is the frequency of the clock signal. However, the output waveform is almost a square-wave and it can produce significant harmonics at critical frequencies.

Harmonic distortion is a problem in communication devices if the reference clock has harmonic frequency components that exactly equal certain receive channel frequencies. This situation creates the potential for the reference clock to produce noise signals that are communicated via radiation and circuit board parasitics and interfere with the desired signal being received. The typical strategy for minimizing the harmonic distortion is to filter the output of the clock driver, making the output waveform closer to a sine wave than a square wave. With conventional circuits, this requires an off-chip filter, physically close to the driver. However this solution is expensive and the addition of a filter increases power dissipation.

The duty cycle of the clock signal is also an important consideration. The output voltage duty cycle is preferably no worse than 45–55%. This is particularly important where the clock signal drives a circuit using both clock edges, such as a digital speech processor integrated circuit (IC). If the duty cycle is worse than 45–55%, the communication device employing the clock signal may fail to operate.

Accordingly, it is desirable to provide a clock driver having improved current characteristics while maintaining the duty cycle and reducing harmonics.

DETAILED DESCRIPTION OF THE INVENTION

Figure 1:
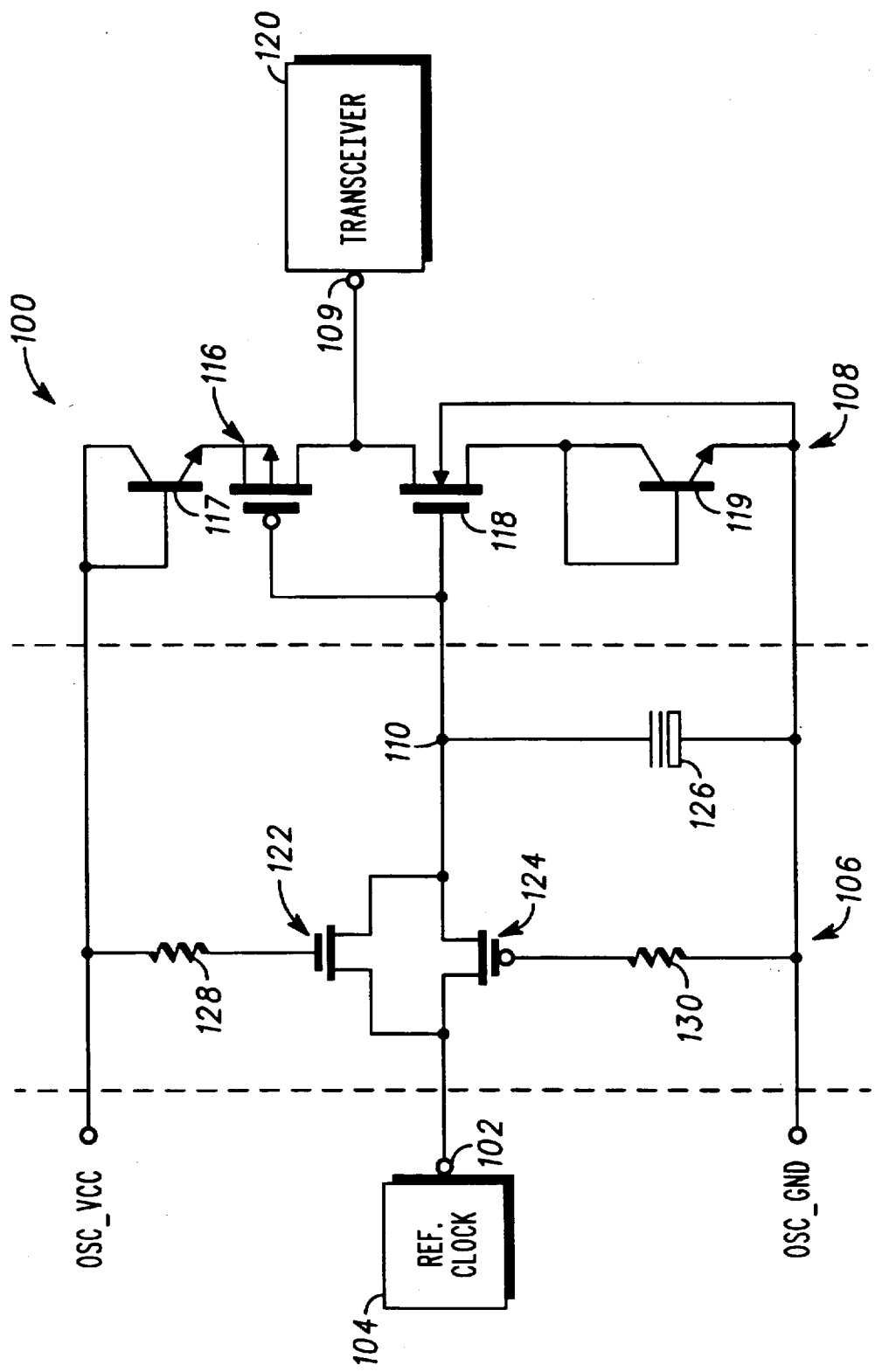
FIG. 1 is a circuit schematic illustrating a reference clock driver.

A novel reference clock diver circuit 100 (FIG. 1) has an input 102 for coupling to a reference clock signal generator 104. A pre-filter 106 is connected to the input to receive the reference signal and output a filtered signal. A complementary FET driver circuit 108 having a cross-over threshold is coupled to the pre-filter 106 to receive the filtered signal and output a conditioned clock signal. The pre-filter 106 can employ FET elements 122 and 124 instead of a resistor to control the duty cycle and compensate for CMOS process variations. The clock driver circuit has improved performance with respect to power dissipation, harmonic distortion and duty cycle relative to prior clock driver circuits.

The pre-filter 106 includes active elements, FET element 122 and FET element 124, and a capacitor 126. The gate of FET element 122 is connected to the high supply voltage OSC_VCC by resistor 128. The voltage OSC_VCC can be approximately 3 Volts, and may be 2.75 Volts relative to OSC_GND. The gate of FET element 124 is connected to the low supply voltage OSC_GND by resistor 130. Resistors 128 and 130 and they can be implemented using any suitable resistor type which provides electro-static discharge (ESD) protection for the gates of FET elements 122 and 124.

The output stage, the complementary FET driver circuit 108, is made up of a diode 117, FET element 116, FET element 118 and a diode 119. The diodes 117 and 119 serve to limit the output voltage relative to a high supply voltage, OSC_VCC and a low supply voltage OSC_GND. The oscillator supply voltage OSC_VCC can for example be 2.75 Volts, as noted above. The low supply voltage, OSC_GND can be circuit ground. The voltage drop across each diode can be approximately 0.75 Volts, reducing the peak-to-peak voltage drop by 1.5 Volts to 1.25 Volts. The diodes 117 and 119 can be implemented using bipolar junction transistors each having the base and collector connected, or any other suitable diode circuit.

The FET elements 116 and 118 can be implemented using any suitable FET. In the immediate implementation, CMOS elements are chosen and sized to produce the current levels required to drive the load, such as transceiver 120, and so that the waveform at output terminal 109 is symmetrical, responsive to signal 200 (FIG. 2) at input 110. Signal 200 is a curve with exponential characteristics.

The back-gate of FET element 116 is connected to its source, rather than Vcc, to minimize its switching threshold and thus minimize its size. The FET elements 122 and 118 are matched, and the FET elements 124 and 116 are matched, as they are made as part of a common IC.

In operation, FET element 116 and FET element 118 are switches, one of which conducts current from a voltage to the output terminal during a portion of a clock duty cycle and the other one of which conducts current from a voltage to the output terminal during another portion of the duty cycle. The transition from one element to the other element occurs at the cross-over threshold.

The output terminal is connected to load 120, which can be any device requiring a clock signal, such as a transmitter, a receiver or a transceiver of a device. The device can be modem, a radio telephone, a pager, or the like.

FET element 122 and FET element 124 provide a variable resistance impedance for filter 106. The charge-cycle resistance is mainly determined by the channel resistance of the P-channel FET element 124. Similarly, the discharge cycle resistance is set by the N-channel FET element 122. The FET elements 122 and 124 are chosen such that each half cycle is about 2.3 time constants. For example, a time constant of the filter is:

$$REQ*C=33K(0.5 \text{ pF})=16.7 \text{ nS}$$

where REQ is the equivalent resistance of FET elements 122 and 124 assuming that the charge and discharge times are equal and C is the capacitance of capacitor 126. This limits the voltage excursion at the pre-filter output to about 80% of OSC_VCC.

Figure 2:
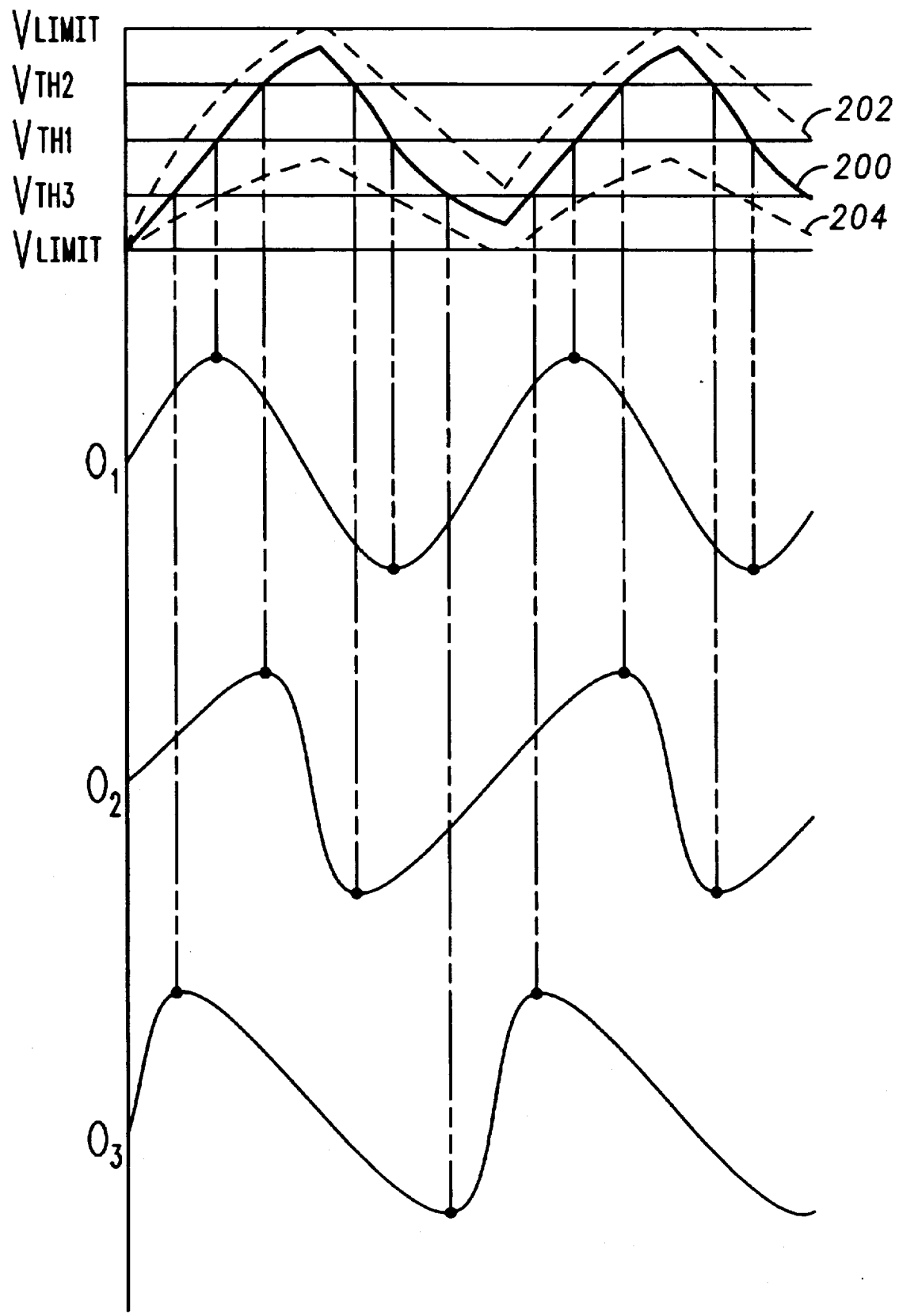
FIG. 2 is a signal diagram illustrating signals in the circuit according to FIG. 1.

The circuit 100 is preferably manufactured on a single integrated circuit. FET elements 122 and 124 and capacitor 126 generate the signal 200 at input 110 responsive to a square wave at input 102. As shown in FIG. 2, if the cross-over threshold is TH1, the output driver circuit will produce a sinusoidal signal O1 having a 50% duty cycle.

However, if the P-channel FET element 116 is strong and the N-channel FET element 118 is weak, and no correction is provided, the cross-over threshold VTH2 is higher. The output signal O2 will thus have a stretched upward cycle and a shortened down cycle as shown in FIG. 2. Compensation is provided by FET elements 122 and 124. The charge cycle is faster for a strong P-channel FET element 124 whereas the discharge cycle through the weak N-channel FET element 122 is slower, producing the signal 202 in FIG. 2. Because the threshold VTH2 is higher, the quick charge allows the signal 202 to cross the threshold at around the same time as the signal 200 crosses threshold VTH1. The discharge rate through the weak N-channel is slower, such that the discharge curve crosses the higher threshold VTH2 at around the same time as signal 200 crosses VTH1. The duty cycle of the compensated output signal is thus about ideal.

When the N-channel FET is strong and the P-channel FET is weak, the cross-over threshold VTH3 of FET elements 116 and 118 is low. Without correction, the charge cycle is short and the discharge cycle is long, such that the distorted output signal O3 is produced. The N-channel FET element 122 and P-channel FET element 124 provide compensation. The strong N-channel FET element 122 causes a fast discharge cycle and the weak P-channel FET element 116 creates a slow charge cycle, producing signal 204. The charge cycle is thus slowed such that the signal 204 crosses the threshold VTH3 at about the same time as the signal 200 crosses the threshold VTH1. The quick discharge allows the signal 204 to cross the low threshold VTH3 at about the same time as the signal 200 crosses the threshold VTH1. Thus, the slow charge and fast discharge with the lower threshold voltage VTH3 produce an output signal at 109 which is minimally affected.

Using FET elements 122 and 124 as time-constant setting resistors for charging and discharging the capacitor 126 in this manner makes the circuit less sensitive to process variations experienced in manufacturing the integrated circuit having FET elements 116, 118, 122, 124. Of primary concern are cases in which the N-channel FET elements are stronger than typical, while the P-channel FET elements are weaker than typical, or vice-versa. This commonly occurs with CMOS processes that utilize a single implant to adjust both Vtn and Vtp. These processes change the input threshold voltage of the driver stage, which results in a poor duty cycle if a resistor is used with the capacitor 126.

Table 1, below shows some of the simulation results. The condition 'StrN' indicates a strong NMOS model and a weak PMOS model. 'StrP' indicates a strong PMOS model and a weak NMOS model. Columns 4 and 5 give the signal amplitudes at the critical harmonic frequencies, which correspond to receive channels. These amplitudes are normalized to the 13 MHz fundamental.

TABLE 1

| Condition | Simulation results | | | |
|---|---|---|---|---|
| | Icc, uA | Duty Cycle | 936 Mhz, dBc | 949 Mhz, dBc |
| typical | 181 | 51.1 | −77.8 | −78.7 |
| StrN, 85° C. | 189 | 50.0 | −86.6 | −78.4 |
| StrP, 85° C. | 188 | 48.8 | −98.0 | −89.8 |
| StrN, −40° C. | 164 | 52.3 | −85.2 | −81.6 |
| StrP, −40° C. | 165 | 53.9 | −76.3 | −80.8 |

This clock driver is connected to a capacitive load Cl, such that the supply current due to the load is:

$$Icc1 = Vpp*Cl*f = Vpp*10 \text{ pF}*13 \text{ Mhz} = Vpp*130 \text{ uA/V}$$

where Vpp is the peak-to-peak voltage. The output voltage swing of this circuit is about 1.3 Volts as noted above, so the supply current Icc1 due to the load capacitance is equal to approximately 170 uA. The total current drawn by this circuit is about 180 uA. If employed in a cellular telephone for example, this helps bring the total standby current in the transceiver IC down to about 600 uA. This is a significant savings relative to prior circuits.

In conclusion, the clock driver topology satisfies the requirements of low harmonic distortion and well-controlled duty cycle. This clock driver draws a minimal amount of supply current and provides a clock signal to digital signal processing IC of a device such as a cellular telephone. Power reduction is particularly important in such applications since they are battery powered. It is desirable to extend the time between charging while reducing the size of batteries to keep the weight and size of cellular telephones to a minimum. This circuit contributes to the reduction of the current drain in such a device.

Thus it can be seen that an improved clock driver circuit is disclosed. The clock driver circuit has significantly lower current drain than prior driver circuits. Additionally, the circuit compensates for variations in the low current output elements using an input filter. The driver circuit thus produces an output signal having the desired duty cycle with minimized interference frequencies and having favorable current characteristics.

We claim:

1. A clock driver comprising:

an input for a reference clock signal;

a filter connected to the input to receive the reference clock signal and outputting a filtered signal at a filter output, the filter including a capacitor; and a complementary FET driver circuit having a cross-over threshold and being coupled to the filter to receive the filtered signal and outputting a conditioned clock signal, wherein the filter includes a resistive component including complementary FET elements that are matched to the complementary FET driver circuit and operate with the capacitor to produce charge and discharge cycles to compensate for variations in a cross-over threshold of the complementary FET driver.

2. The clock driver as defined in claim 1, wherein the complementary FET driver circuit includes a P-channel MOSFET element and an N-channel MOSFET element.

3. The clock driver as defined in claim 2, wherein the P-channel MOSFET element has a gate coupled to the filter output and a source and drain coupled between a high supply voltage and the output terminal.

4. The clock driver as defined in claim 3, wherein the N-channel MOSFET element includes a gate coupled to the filter output and a source and drain coupled between a low supply voltage and the output terminal.

5. The clock driver as defined in claim 4, further including a diode connected between the P-channel MOSFET element and the high supply voltage and a diode connected between the N-channel MOSFET element and the low supply voltage.

6. The clock driver as defined in claim 2, wherein the complementary FET elements includes a second P-channel MOSFET element and a second N-channel MOSFET element.

7. The clock driver as defined in claim 6, wherein a gate of the second P-channel MOSFET element is coupled to a first reference potential.

8. The clock driver as defined in claim 7 wherein the gate of the second N-channel MOSFET element is coupled to a second reference potential.

9. An integrated driver circuit comprising:

a first switch conducting a current from a first voltage to an output terminal during a portion of a clock duty cycle;

a second switch conducting current from a second voltage to the output terminal during another portion of the clock duty cycle, wherein the first and second switches have a cross-over threshold;

a filter including a first active element providing a resistance for a charge-cycle of the filter and a second active element providing a resistance for a discharge-cycle of the filter, wherein the first switch and the first active element are matched and the second switch and the second active element are matched, whereby the charge-cycle and the discharge-cycle are set for the cross-over threshold.

10. The integrated driver circuit as defined in claim 9, wherein the first switch and the first active element are P-channel FET elements.

11. The integrated driver circuit as defined in claim 9, wherein the second switch and the second active element are N-channel FET elements.

12. The integrated driver circuit as defined in claim 9, wherein the filter further includes a capacitor, and the first active element is active to provide a charging current for the capacitor and the second active element is active to discharge the capacitor.

13. The clock driver as defined in claim 8 wherein the first and second reference potentials are different.

14. The integrated driver circuit as defined in claim 12, wherein the first active element is coupled to the second voltage through a first resistor and the second active element is coupled to the first voltage through a second resistor.

15. The integrated driver circuit as defined in claim 14, wherein the first active element comprises a first FET element, the first resistor connected between the second voltage and a gate of the first FET element.

16. The integrated driver circuit as defined in claim 15, wherein the second active element comprises a second FET element, the second resistor connected between the first voltage and a gate of the second FET element.

17. The integrated driver circuit as defined in claim 16, further including a diode connected between the first switch and the first voltage and a diode connected between the second voltage and the second switch.

18. The integrated driver circuit as defined in claim 17, wherein the first switch is an FET element and the second switch is an FET element.

19. A method of conditioning a clock signal output from a reference clock in a circuit including a complementary driver circuit, the complementary driver circuit having a control input and outputting an oscillating signal having an output signal duty cycle, the reference clock signal having a reference signal duty cycle, the method comprising the steps of:

gradually increasing the control input to the complementary driver circuit at a first rate during a first portion of the reference signal duty cycle;

gradually decreasing the control input to the complementary driver circuit at a second rate during a second portion of the reference signal duty cycle;

driving an output of the complementary driver circuit with a first driver of the complementary driver when the control input is above a cross-over threshold and driving the output of the complementary driver circuit with a second driver of the complementary driver circuit when the control input is below the cross-over threshold, wherein the first rate and the second rate are set for the cross-over threshold such that the driver generates a desired duty cycle; and wherein the step of gradually increasing the control input is implemented using an element matched to one of the first and second drivers of the complementary driver.

20. The method as defined in claim 19 wherein the step of gradually decreasing the control input is implemented using an element matched to the other one of the first and second drivers of the complementary driver.

* * * * *